United States Patent
Ueda et al.

(10) Patent No.: US 7,180,925 B2
(45) Date of Patent: Feb. 20, 2007

(54) SEMICONDUCTOR LASER DEVICE AND MANUFACTURING METHOD THEREFOR

(75) Inventors: Yoshiaki Ueda, Tenri (JP); Keisuke Miyazaki, Ikoma (JP); Kazuhiko Wada, Yamatokooriyama (JP); Masaki Tatsumi, Tenri (JP); Taiji Morimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 166 days.

(21) Appl. No.: 10/715,025

(22) Filed: Nov. 18, 2003

(65) Prior Publication Data
US 2004/0101014 A1    May 27, 2004

(30) Foreign Application Priority Data
Nov. 18, 2002    (JP) .............................. 2002-333509

(51) Int. Cl.
*H01S 5/00* (2006.01)
(52) U.S. Cl. ................. 372/45.01; 372/46.01
(58) Field of Classification Search ........... 372/50.121, 372/50.12, 45.013, 18, 45.01, 46.01
See application file for complete search history.

(56) References Cited

U.S. PATENT DOCUMENTS

| | | | | |
|---|---|---|---|---|
| 5,822,350 A | * | 10/1998 | Nishimura et al. | 372/46.01 |
| 5,963,572 A | * | 10/1999 | Hiroyama et al. | 372/46.01 |
| 6,031,858 A | * | 2/2000 | Hatakoshi et al. | 372/46.01 |
| 6,468,820 B2 | * | 10/2002 | Narui | 438/22 |
| 6,483,127 B2 | * | 11/2002 | Saeki | 257/96 |
| 6,516,016 B1 | * | 2/2003 | Fukunaga et al. | 372/45.01 |
| 6,778,575 B2 | * | 8/2004 | Hiroyama et al. | 372/45.01 |

FOREIGN PATENT DOCUMENTS

| | | |
|---|---|---|
| JP | 10-294529 A | 11/1998 |
| JP | 2000-315838 | 11/2000 |
| JP | 2001-44561 | 2/2001 |
| JP | 2001-57462 | 2/2001 |
| JP | 2001-345514 | 12/2001 |
| JP | 2003-309329 | 10/2003 |

OTHER PUBLICATIONS

Chinese Action dated Jun. 10, 2005, directed to counterpart foreign application.

* cited by examiner

*Primary Examiner*—Minsun Oh Harvey
*Assistant Examiner*—Tod T. Van Roy
(74) *Attorney, Agent, or Firm*—Morrison & Foerster LLP

(57) ABSTRACT

A light confinement layer constructed of a semiconductor that has a refractive index different from that of p-type second cladding layers is formed to a small film thickness of not greater than 2 μm (about 0.5 μm) on the whole surface of ridge portions of two semiconductor lasers. Thus, the light confinement layer on the ridge portions is made roughly flat so as to be easily removable by etching. As a result, the exposure of p-type second cladding layers of the ridge portions due to deep etching is prevented to allow the confinement of light into the p-type cladding layers to be stably effected. A dielectric film is formed on the light confinement layer and reinforces the current constriction function lost by the reduction in the thickness of the light confinement layer.

8 Claims, 8 Drawing Sheets

FIRST-TIME CRYSTAL GROWTH

PARTIAL REMOVAL OF LAYER OF FIRST-TIME CRYSTAL GROWTH

SECOND-TIME CRYSTAL GROWTH

PRIOR ART

SEMICONDUCTOR LASER DEVICE AND MANUFACTURING METHOD THEREFOR

BACKGROUND OF THE INVENTION

This invention relates to a semiconductor laser device in which a plurality of semiconductor lasers are formed on one semiconductor substrate and a manufacturing method therefor.

In recent years, optical disks have been popularized, and the recording formats thereof have had numbers of variations. When optically reading optical disks of different standards, semiconductor lasers of different standards are needed. For example, in order to read two types of optical disks of CD (Compact Disc) and DVD (Digital Versatile Disc), there are needed an infrared laser of an emission wavelength of about 780 nm and a red laser of an emission wavelength of about 650 nm.

In the above case, there has been demanded the appearance of a semiconductor laser device capable emitting laser light rays of two wavelengths in one package for the downsizing and cost reduction of the pickup.

Moreover, there has been demanded the appearance of a semiconductor laser device capable of emitting two laser light rays of two wavelengths in one package or emitting laser light rays of two types for a low output and a high output even at same wavelength for laser light printers and recording-and-reproducing type optical disks other than the optical disks. Furthermore, a laser of two beams of same outputs having same wavelength can also be considered.

In order to satisfy these demands, there has been developed the technology of providing two semiconductor lasers on one semiconductor substrate. However, when forming semiconductor lasers of two different characteristics on a single semiconductor substrate, it is often the case where the device cannot be formed through one-time crystal growth. Accordingly, the present applicant has proposed the method of carrying out crystal growth a plurality of times on a single semiconductor substrate although the method has not been yet known, i.e., is not a prior art. That is, the method has the processes of firstly growing one laser structure on a semiconductor substrate, partially etching the laser structure crystallinically grown at the first time for the exposure of the semiconductor substrate, thereafter crystallinically growing another laser structure superposed on them at the second time and removing the portion of the subsequently formed laser structure on the precedently grown laser structure.

FIGS. 3A, 3B and 3C through 3G show the cross-sections of a semiconductor laser device in which two semiconductor lasers of an AlGaAs based semiconductor laser and an AlGaInP based semiconductor laser are grown on a GaAs substrate. First of all, as shown in FIG. 3A, an AlGaAs based semiconductor laser 9 constructed of an n-type GaAs buffer layer 2, an n-type AlGaAs first cladding layer 3, an AlGaAs first guide layer 4, a multiple quantum well active layer 5, an AlGaAs second guide layer 6, a p-type AlGaAs second cladding layer 7 and a p-type GaAs contact layer (Zn-doped) 8 is grown on an n-type GaAs substrate 1. Then, as shown in the right-hand side portion in FIG. 3A, a partial region of the AlGaAs based semiconductor laser 9 is removed by etching until the n-type GaAs substrate 1 is exposed.

Subsequently, as shown in FIG. 3B, an AlGaInP based semiconductor laser 18 constructed of an n-type GaAs buffer layer 11, an n-type AlGaInP first cladding layer 12, an AlGaInP first guide layer 13, a multiple quantum well active layer 14, an AlGaInP second guide layer 15, a p-type AlGaInP second cladding layer 16 and a p-type GaAs contact layer 17 is grown all over the surface.

Next, as shown in FIG. 3C, a region of the subsequently formed AlGaInP based semiconductor laser 18 superposed on the precedently formed AlGaAs based semiconductor laser 9 is removed by etching. Further, a boundary portion located between the AlGaAs based semiconductor laser 9 and the AlGaInP based semiconductor laser 18 on the n-type GaAs substrate 1 is removed until the n-type GaAs substrate 1 is exposed, forming a semiconductor laser device in which the AlGaAs based semiconductor laser 9 and the AlGaInP based semiconductor laser 18 are juxtaposed on the n-type GaAs substrate 1.

Subsequently, as shown in FIG. 3D, the p-type GaAs contact layer 8 and the p-type AlGaAs second cladding layer 7 of the AlGaAs based semiconductor laser 9 are removed wholly and partway, respectively, by etching so that only the center portion is left by a prescribed width, forming a stripe-shaped ridge portion 10 in the center portion. At the same time, the p-type GaAs contact layer 17 and the p-type AlGaInP second cladding layer 16 of the AlGaInP based semiconductor laser 18 are removed wholly and partway, respectively, by etching, forming a stripe-shaped ridge portion 20 in a center portion.

Subsequently, as shown in FIG. 3E, an n-type GaAs current constriction layer 21 is grown all over the AlGaAs based semiconductor laser 9 and the AlGaInP based semiconductor laser 18. Subsequently, as shown in FIG. 3F, an unnecessary portion of the n-type GaAs current constriction layer 21 located on upper portions of the ridge portions 10 and 20 and an element isolating portion 22 are removed by etching, so that currents flow only in the ridge portions 10 and 20.

Subsequently, as shown in FIG. 3G, a p-type AuZn/Au electrode 23 is formed on the whole surface of the AlGaAs based semiconductor laser 9. At the same time, a p-type AuZn/Au electrode 24 is formed on the whole surface of the AlGaInP based semiconductor laser 18. Further, an n-type AuGe/Ni electrode 25 is formed on the whole back surface of the n-type GaAs substrate 1.

Thus, as shown in FIG. 3G, there is formed a semiconductor laser device, in which the two semiconductor lasers of the AlGaAs based semiconductor laser 9 and the AlGaInP based semiconductor laser 18 are provided on one n-type GaAs substrate 1.

However, the aforementioned semiconductor laser device manufacturing method for carrying out the crystal growth a plurality of times on the single semiconductor substrate has the following problems. That is, as shown in FIG. 3E, the n-type GaAs current constriction layer 21 is grown all over the AlGaAs based semiconductor laser 9 and the AlGaInP based semiconductor laser 18, and therefore, the n-type GaAs current constriction layer 21 is also formed on the ridge portions 10 and 20. Therefore, it is required to remove the n-type GaAs current constriction layer 21 formed on the ridge portions 10 and 20 so that currents flow in the ridge portions 20 and 21. The removal in the above-mentioned case is carried out by protecting the portions other than the upper portions of the exposed ridge portions 10 and 20 and the element isolating portion 22 with a resist and by etching only exposed upper portions on the ridge portions 10 and 20 and element isolating portion 22.

However, as shown in FIGS. 4A, 4B and 4C, the unnecessary n-type GaAs current constriction layer 21, which is formed on the ridge portions 10 and 20 (represented by the ridge portion 10 located on the AlGaAs based semiconductor laser 9 side in the figure), grows in a trapezoidal shape that has the width of the upper surfaces of the ridge portions 10 and 20 roughly as the base, and the trapezoid comes to have an increasing height as the thickness of the n-type GaAs current constriction layer 21 increases and comes to have a shape close to a triangle.

Therefore, when this unnecessary n-type GaAs current constriction layer 21 having the shape close to a triangle is removed by etching as shown in FIGS. 5A and 5B (represented by the ridge portion 10), since the etching progresses roughly uniformly, the etching is required to be effected more deeply in order to completely expose the upper surfaces of the ridge portions 10 and 20. Therefore, in the portion of the n-type GaAs current constriction layer 21 which extends along the edge portions of the upper surface of the ridge portion 10 and which is thin as shown in FIG. 5A, the etching reaches down to the p-type second cladding layer 7 as shown in FIG. 5B, and the p-type second cladding layer 7 of the ridge portion 10 is disadvantageously exposed. Although not shown, the same thing can be said for the p-type second cladding layer 16 of the ridge portion 20.

Then, the neighborhood of the active layer for emitting laser light is exposed, and the confinement of the laser light becomes unstable. Moreover, the laser characteristics also deteriorate. It is to be noted that the reference numeral 26 denotes a resist in FIGS. 5A and 5B.

Therefore, when etching the unnecessary n-type GaAs current constriction layer 21, it is required to expose neither of the p-type second cladding layers 7 and 16, and therefore, the etching requires very advanced controllability. Furthermore, when a plurality of semiconductor lasers are integrally formed on a single semiconductor substrate, it is required to concurrently control the etching of a plurality of ridge portions, and this makes it more difficult to etch the unnecessary n-type GaAs current constriction layer 21.

As a countermeasure against the aforementioned problem, there can be considered a method for reducing the film thickness of the n-type GaAs current constriction layer 21 to be grown in order to suppress low the height of the trapezoid of the n-type GaAs current constriction layer 21 on the ridge portions 10 and 20 as shown in FIG. 6A (only the ridge portion 10 is shown, and the same thing can be said for the ridge portion 20). However, a current leaks out of the ridge portions 10 and 20 as the film thickness of the n-type GaAs current constriction layer 21 is reduced, disadvantageously loosing the current confinement effect. In the above case, the leak current is increased to deteriorate the reliability, further causing the occurrence of no laser oscillation obtained.

Moreover, as shown in FIG. 6B, there may be the case where eaves-like protrusions are generated on the p-type GaAs contact layer 8 due to a difference between the compositions of the p-type GaAs contact layer 8 and the p-type second cladding layer 7 during the etching in forming the ridge portion 10 (see FIG. 3D). If the n-type GaAs current constriction layer 21 is thinly formed by the MBE (Molecular Beam Epitaxy) method in this state, then the n-type GaAs current constriction layer 21 is not grown on the back surface side of the eaves of the p-type GaAs contact layer 8 as shown in FIG. 6B. In the above case, there is a problem that the side surfaces of the p-type GaAs contact layer 8 and the p-type second cladding layer 7, which constitute the ridge portion 10, are not covered with the n-type GaAs current constriction layer 21, and the p-type second cladding layer 7 is disadvantageously exposed similarly to the case of FIG. 5B. Although not shown, there is a similar problem concerning the ridge portion 20, the p-type second cladding layer 16 and the p-type GaAs contact layer 17 of the semiconductor laser 18.

SUMMARY OF THE INVENTION

Accordingly, the object of this invention is to provide a semiconductor laser device having a plurality of semiconductor lasers that can be formed stably easily without loosing the current confinement effect or exposing the second cladding layer.

In order to achieve the above-mentioned object, this invention provides a semiconductor laser device in which a plurality of semiconductor lasers are juxtaposed on a semiconductor substrate, the semiconductor lasers each comprising:

an active layer;

a first cladding layer and a second cladding layer arranged on both sides of the active layer; and a contact layer located on the second cladding layer, wherein part of the second cladding layer and the contact layer constitutes a ridge portion, and the semiconductor laser device comprising:

a light confinement layer, which is provided in a region other than an upper surface of the ridge portion of each of the second cladding layers and has a refractive index different from that of the second cladding layers; and a dielectric film provided on the light confinement layer.

According to the above-mentioned construction, the light confinement layer, which is provided in the region other than the upper surface of the ridge portion and has a refractive index different from that of the second cladding layer, functions as a transverse mode control layer for confining light in the second cladding layer. Moreover, the dielectric film laminated on the light confinement layer functions as a current constriction layer that flows no current in the portions other than the ridge portion. Therefore, the light confinement layer, which is not required to function as a current constriction layer, can be made thin within a range in which the layer can function as a transverse mode control layer.

Therefore, the light confinement layer formed on the ridge portion becomes roughly flat, allowing the etching in removing the unnecessary light confinement layer on the ridge portion to be easy. As a result, there is no need to carry out deep etching, and this prevents the exposure of the second cladding layer of the side surfaces of the ridge portion, stably achieving the confinement of light in the second cladding layer.

Moreover, in one embodiment, the dielectric film functions as a current constriction layer that flows no current in portions other than the ridge portion.

According to this embodiment, the dielectric film functions as a current constriction layer that flows no current in the portions other than the ridge portion. Therefore, the light confinement layer can be made thin within the range in which the layer can function as a transverse mode control layer and formed roughly flat on the ridge portion.

In one embodiment, the dielectric film is an insulation film.

According to this embodiment, the dielectric film is an insulation film. Therefore, the dielectric film functions as a current constriction layer that flows no current in the portions other than the ridge portion.

In one embodiment, the dielectric film has a film thickness of not greater than 0.5 μm.

According to this embodiment, the dielectric film, which has a film thickness of not greater than 0.5 μm, is therefore easily removed by etching in removing the unnecessary light confinement layer on the ridge portion. Furthermore, the dielectric film is allowed to have sufficient heat dissipation.

In one embodiment, the light confinement layer has a conductive type opposite to that of the second cladding layer.

According to this embodiment, the light confinement layer has a conductive type opposite to that of the second cladding layer. Therefore, the current confinement effect with respect to the ridge portion is further improved, and further stabilized light emission can be obtained.

In one embodiment, the light confinement layer is a high-resistance layer having a resistance value of not smaller than $1 \times 10^2$ Ω·cm.

According to this embodiment, the light confinement layer is constructed of the high-resistance layer. Therefore, the current confinement effect with respect to the ridge portion is further improved, and further stabilized light emission can be obtained.

In one embodiment, the light confinement layer functions as a loss guide that absorbs light from the active layer and confines light in the second cladding layer.

According to this embodiment, the light confinement layer functions as a loss guide that absorbs light. Therefore, an effective refractive index difference occurs in the active layer. Therefore, by controlling the layer thickness of the portion of the second cladding layer other than the ridge portion, the device can function as a so-called self-oscillation laser.

In one embodiment, the light confinement layer has a film thickness of not greater than 2 μm.

According to this embodiment, the light confinement layer has a film thickness of not greater than 2 μm. Therefore, the light confinement layer formed on the ridge portion becomes roughly flat, and the unnecessary light confinement layer on the ridge portion is easily removed by etching.

Furthermore, the semiconductor laser device manufacturing method of this invention, in forming the semiconductor laser device of the aforementioned invention, grows the dielectric layer on side surfaces of the ridge portion and on back surfaces of sidewise protrusions (eaves) of the ridge portion by a CVD (Chemical Vapor Deposition) method.

According to the above-mentioned construction, in forming the semiconductor laser device of the above-mentioned invention, the dielectric film is reliably easily grown also on the side surfaces of the ridge portion and on the back surfaces of the eaves of the ridge portion. Therefore, the second cladding layer is reliably protected, leaving no exposed portion of the second cladding layer in the neighborhood of the active layer that emits laser light, and the laser light confinement in the second cladding layer is stably achieved. Thus, the laser characteristics are prevented from deteriorating.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED INVENTION

Figure 1A:
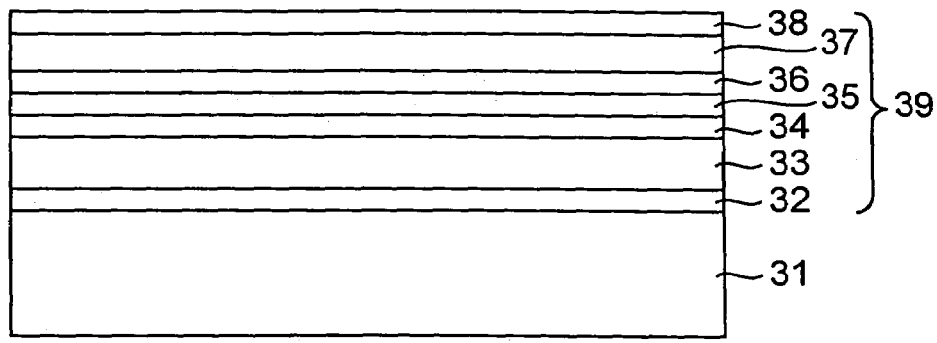
FIGS. 1A, 1B, and 1C through 1J are sectional views of a semiconductor laser device of this invention in manufacturing processes.

The present invention will be described in detail below on the basis of the embodiments shown in the drawings.

(The First Embodiment)

FIGS. 1A, 1B, and 1C through 1J are sectional views of the semiconductor laser device of the present first embodiment in manufacturing processes. The manufacturing method of the present semiconductor laser device will be described with reference to FIGS. 1A, 1B and 1C through 1J.

First of all, as shown in FIG. 1A, an n-type GaAs buffer layer 32, an n-type AlGaAs first cladding layer 33, an AlGaAs first guide layer 34, a multiple quantum well active layer 35, an AlGaAs second guide layer 36, a p-type AlGaAs second cladding layer 37 and a p-type GaAs contact layer (Zn-doped) 38 are successively grown on an n-type GaAs substrate 31 by MOCVD (Metal-Organic Chemical Vapor Deposition), forming an AlGaAs based semiconductor laser 39 as one example of the semiconductor laser. Thus, the first-time crystal growth is achieved.

Figure 1B:
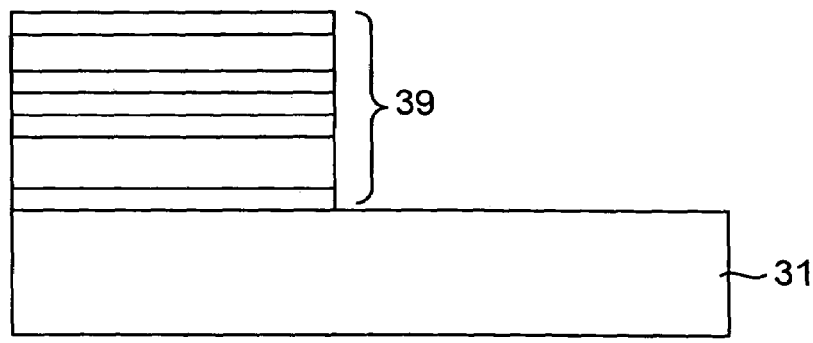
Figure 1C:
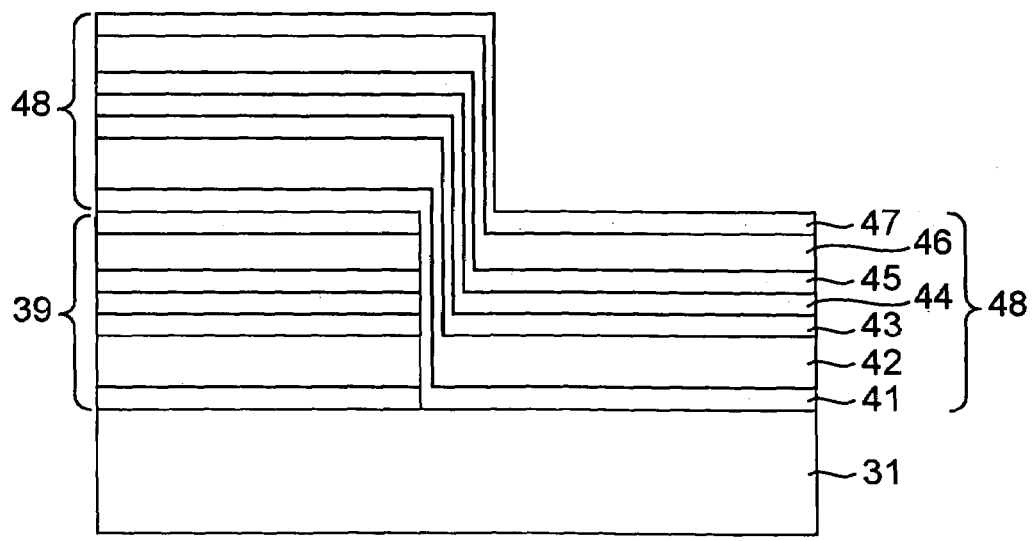

Next, as shown in FIG. 1B, a partial region of the AlGaAs based semiconductor laser 39 is removed by etching. Next, as shown in FIG. 1C, an n-type GaAs buffer layer 41, an n-type AlGaInP first cladding layer 42, an AlGaInP first guide layer 43, a multiple quantum well active layer 44, an AlGaInP second guide layer 45, a p-type AlGaInP second cladding layer 46 and a p-type GaAs contact layer 47 are successively grown all over the surface by MOCVD, forming an AlGaInP based semiconductor laser 48 as one example of the semiconductor laser. Thus, the second-time crystal growth is achieved.

Although the layers are depicted so that the layers are bent at right angles to vertically extend at the boundary between the AlGaInP based semiconductor laser 48 grown on the n-type GaAs substrate 31 and the AlGaInP based semiconductor laser 48 grown on the AlGaAs based semiconductor laser 39 in FIG. 1c, the layers are practically formed so as to draw gentle curves.

Figure 1D:
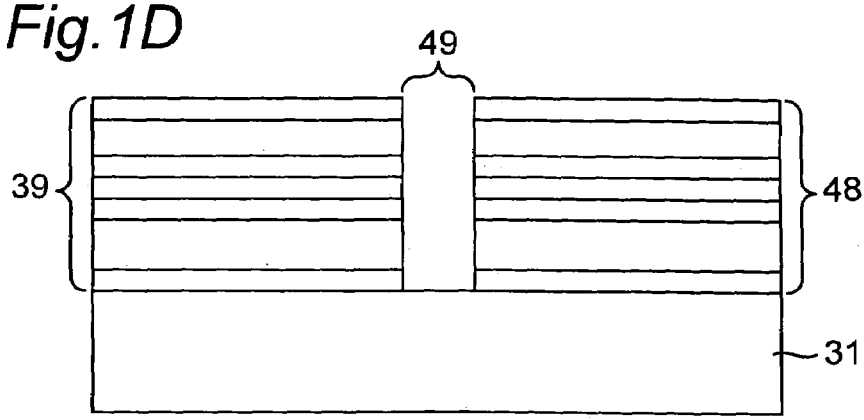

Next, as shown in FIG. 1D, the region of the subsequently formed AlGaInP based semiconductor laser 48 superposed on the precedently formed AlGaAs based semiconductor laser 39 as well as a boundary region 49 located between the AlGaAs based semiconductor laser 39 on the n-type GaAs substrate 31 and the AlGaInP based semiconductor laser 48 are removed until the n-type GaAs substrate 31 is exposed, so that a semiconductor laser device in which the AlGaAs based semiconductor laser 39 and the AlGaInP based semiconductor laser 48 are juxtaposed on the n-type GaAs substrate 31 is formed.

Figure 1E:
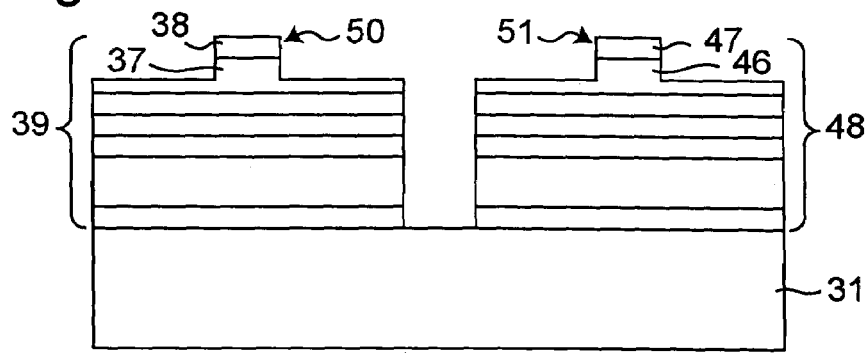

Subsequently, as shown in FIG. 1E, the p-type GaAs contact layer 38 and the p-type AlGaAs second cladding layer 37 of the AlGaAs based semiconductor laser 39 are removed wholly and partway, respectively, by etching so that the center portion is left by a prescribed width, forming a stripe-shaped ridge portion 50 in the center portion. At the same time, the p-type GaAs contact layer 47 and the p-type AlGaInP second cladding layer 46 of the AlGaInP based semiconductor laser 48 are removed wholly and partway, respectively, by etching with the center portion left by a prescribed width, forming a stripe-shaped ridge portion 51 in the center portion.

Figure 1F:
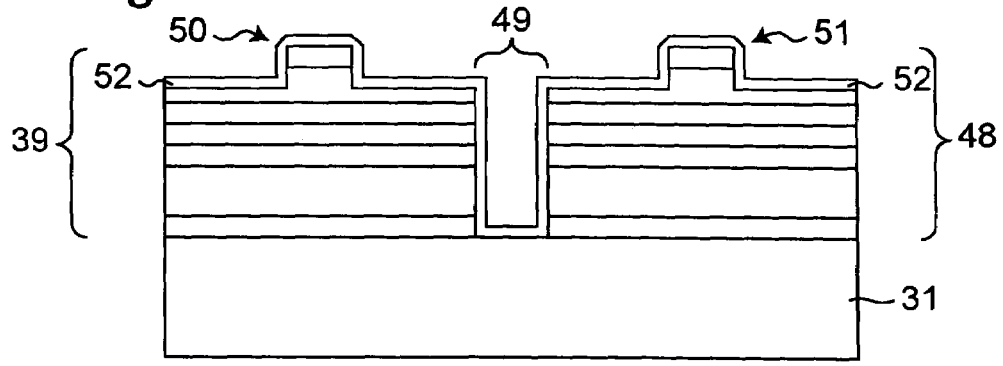

Next, as shown in FIG. 1F, a light confinement layer constructed of a semiconductor that has a refractive index different from that of the p-type second cladding layers 37 and 46 is formed all over the surface including the boundary region 49 by the MOCVD or the MBE method. In the present embodiment, an n-type GaAs layer 52 is formed as the light confinement layer that has a refractive index different from that of the p-type second cladding layers 37 and 46. In the above case, the n-type GaAs layer 52 is grown to a layer thickness of not greater than 2 μm (preferably about 0.5 μm) so as to be subsequently easily removed by etching. Although the light confinement layer is constructed of the n-type GaAs layer 52 in the present first embodiment, the layer can also be constructed of a GaAs layer that has a high resistance value of not smaller than $1 \times 10^2$ Ω·cm.

Figure 1G:
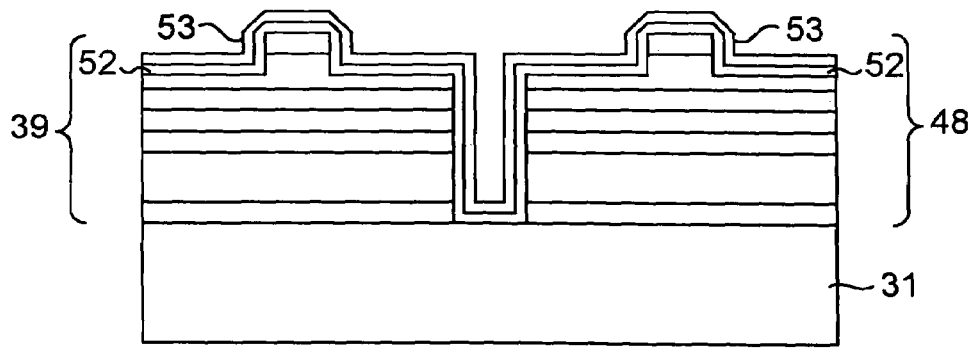

Subsequently, as shown in FIG. 1G, an SiN film 53 as one example of the dielectric film is formed on the whole surface of the n-type GaAs layer 52 by the PCVD (Plasma-Activated Chemical Vapor Deposition) method. In the above case, the SiN film 53 has a film thickness of not greater than about 0.5 μm since heat dissipation is reduced as the film thickness is increased. Although the dielectric film is constructed of the SiN film in the present first embodiment, a similar effect can be obtained even when the layer is constructed of an insulation film made of SiO, AlO or the like.

Figure 1H:
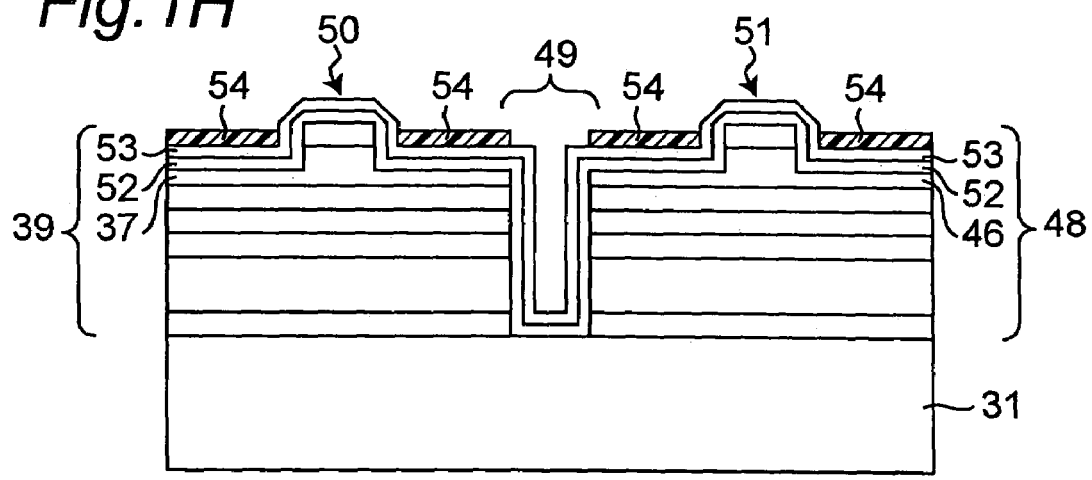
Figure 1I:
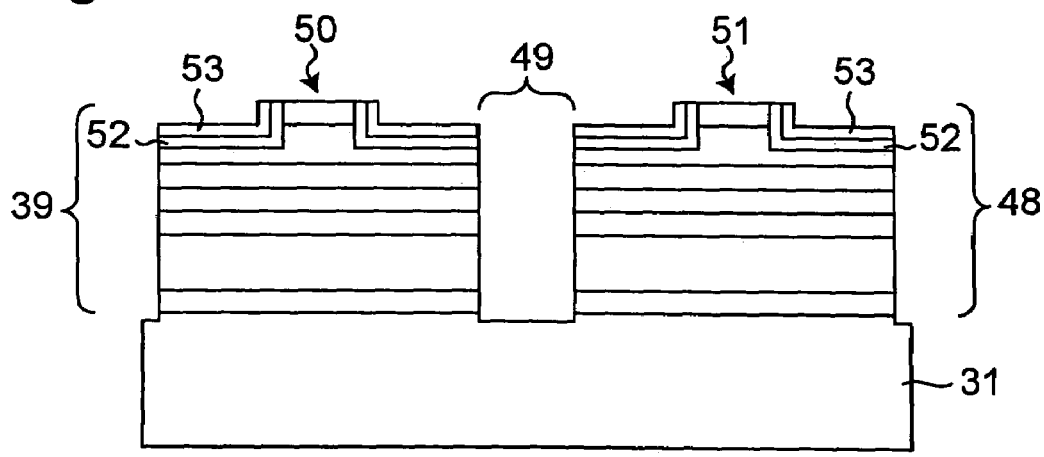

Next, as shown in FIG. 1H, the regions excluding the ridge portions 50 and 51 and the boundary region 49 located between the AlGaAs based semiconductor laser 39 and the AlGaInP based semiconductor laser 48 are protected by a resist 54. Then, as shown in FIG. 1I, the unnecessary SiN film 53 and the unnecessary n-type GaAs layer 52 which are formed on the ridge portions 50 and 51 and the boundary region 49 are removed by etching.

In the above case, as described hereinabove, the n-type GaAs layer 52 and the SiN film 53 are thinly formed to have a thickness of about 0.5 μm and a thickness of not greater than 0.5 μm, respectively. Therefore, the n-type GaAs layer 52 and the SiN film 53, which are roughly flat on the ridge portions 50 and 51, can easily be removed by etching.

The light confinement layer (n-type GaAs layer 52), which is constructed of the semiconductor that has a refractive index different from that of the p-type second cladding layers 37 and 46, functions as a transverse mode control layer that confines light in the second cladding layers 37 and 46. Moreover, the dielectric film (SiN film 53) functions as a current constriction layer that flows no current in the portions other than the ridge portions 50 and 51. Therefore, the n-type GaAs layer 52 that has a refractive index different from that of the p-type second cladding layers 37 and 46 can be thinly formed within a range in which the light confinement function is assured, and the etching for removing the unnecessary n-type GaAs layer 52 on the ridge portions 50 and 51 can easily be achieved.

Figure 1J:
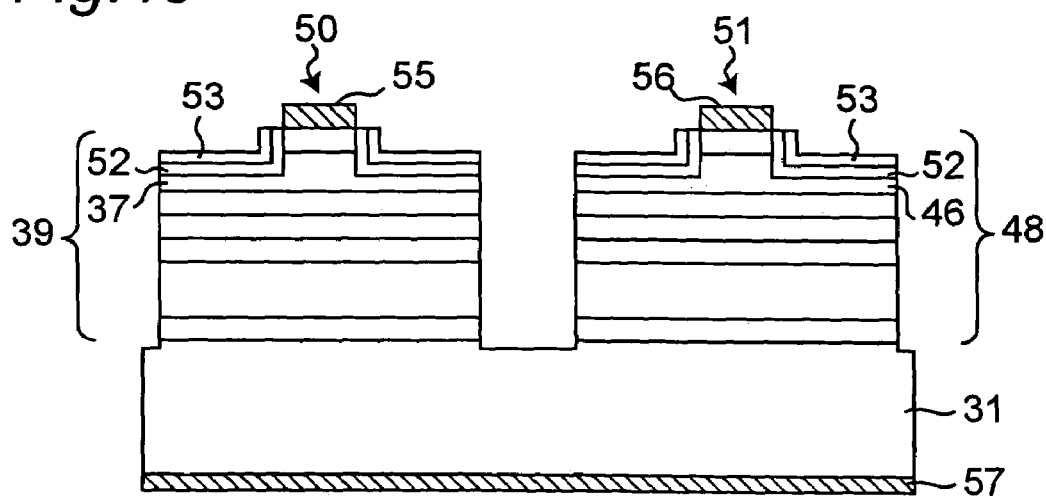

Next, as shown in FIG. 1J, p-type AuZn/Au electrodes 55 and 56 are formed on the ridge portion 50 of the AlGaAs based semiconductor laser 39 and the ridge portion 51 of the AlGaInP based semiconductor laser 48, respectively. Further, an n-type AuGe/Ni electrode 57 is formed on the whole back surface of the n-type GaAs substrate 31.

Thus, as shown in FIG. 1J, there is formed a semiconductor laser device, in which the two semiconductor lasers of the AlGaAs based semiconductor laser 39 and the AlGaInP based semiconductor laser 48 are integrated on one n-type GaAs substrate 31.

Since the n-type GaAs layer 52 functions as a loss guide that absorbs light, a so-called self-oscillation laser can also be provided by controlling the layer thickness of the p-type second cladding layers 37 and 46 other than the ridge portions 50 and 51.

As described above, in the present first embodiment, the ridge portions 50 and 51 are formed on the AlGaAs based semiconductor laser 39 and the AlGaInP based semiconductor laser 48, and thereafter, the n-type GaAs layer 52, which is the light confinement layer that has a refractive index different from that of the p-type second cladding layers 37 and 46, is formed to a film thickness of not greater than 2 μm (preferably about 0.5 μm). Therefore, the n-type GaAs layer 52 is roughly flat on the ridge portions 50 and 51 and is able to be easily removed by etching. Therefore, the aforementioned etching is not required to be deeply effected, and the p-type second cladding layers 37 and 46 and the p-type GaAs contact layers 38 and 47 of the ridge portions 50 and 51 can be prevented from being exposed.

As a result, the confinement of light in the second cladding layers 37 and 46 can be stably achieved, and the laser characteristics can be prevented from deteriorating.

However, if the n-type GaAs layer 52 is thinly formed, then the function as the current constriction layer is reduced. Accordingly, by forming the SiN film 53 as a dielectric film on the n-type GaAs layer 52, the current constriction function is reinforced.

With the above arrangement, it is possible to stably easily form a semiconductor laser device that has two semiconductor lasers, which effectively carry out the current confinement and in which neither of the second cladding layers 37 and 46 is exposed.

In the above case, the light confinement layer of which the refractive index is different from that of the p-type second cladding layers 37 and 46 is the n-type GaAs layer 52 that has a conductive type opposite to that of the p-type second cladding layers 37 and 46. Therefore, the effect of confining a current in the ridge portions 50 and 51 is further improved, and further stabilized light emission can be obtained.

It is also possible to constitute the light confinement layer of a GaAs layer that has a high resistance value of not smaller than $1 \times 10^2$ Ω·cm. In the above case, the effect of confining a current in the ridge portions 50 and 51 is further improved, and further stabilized light emission can be obtained.

(The Second Embodiment)

The present second embodiment is related to the case where eaves are formed on the p-type GaAs contact layers that constitute the ridge portions of a semiconductor laser. FIGS. 2A, 2B, 2C and 2D show cross-sections of the semiconductor laser device of the present second embodiment in the manufacturing processes. The manufacturing method of the present semiconductor laser device will be described with reference to FIGS. 2A, 2B, 2C and 2D.

Figure 2A:
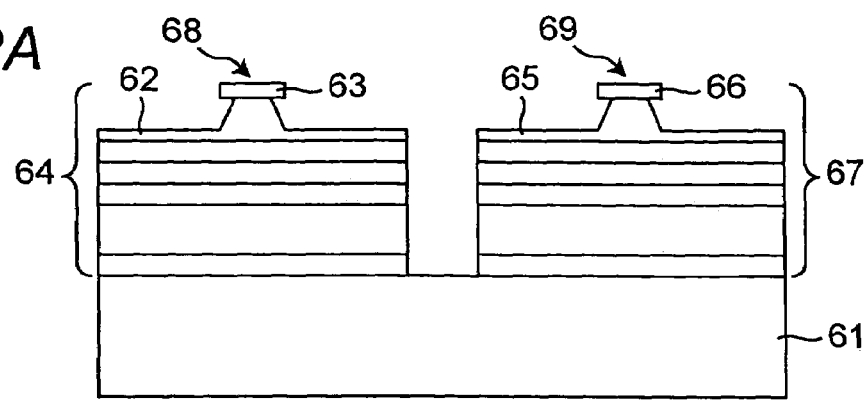
FIGS. 2A, 2B, 2C and 2D are sectional views of a semiconductor laser device different from that of FIGS. 1A, 1B, and 1C through 1J in manufacturing processes.

First of all, similarly to FIGS. 1A through 1E of the first embodiment, an AlGaAs based semiconductor laser 64 and an AlGaInP based semiconductor laser 67 are formed by carrying out crystal growth two times on a single n-type GaAs substrate 61, and ridge portions 68 and 69 are formed on both the semiconductor lasers 64 and 67. In the above case, if there is a difference in the etching rate between the p-type second cladding layers 62 and 65 and the p-type GaAs contact layers 63 and 66 of both the semiconductor lasers 64 and 67, eaves are formed as sidewise protrusions on the p-type GaAs contact layers 63 and 66 of the ridge portions 68 and 69. Thus, the state of FIG. 2A is provided.

The eaves of the ridge portions 68 and 69 are generated depending on the difference in the etching rate between the p-type second cladding layers 62 and 65 and the p-type GaAs contact layers 63 and 66, and therefore, the eaves are inevitably generated more or less. Particularly when the wet etching is effected for a longer time, the eaves are formed more remarkably.

Figure 2B:
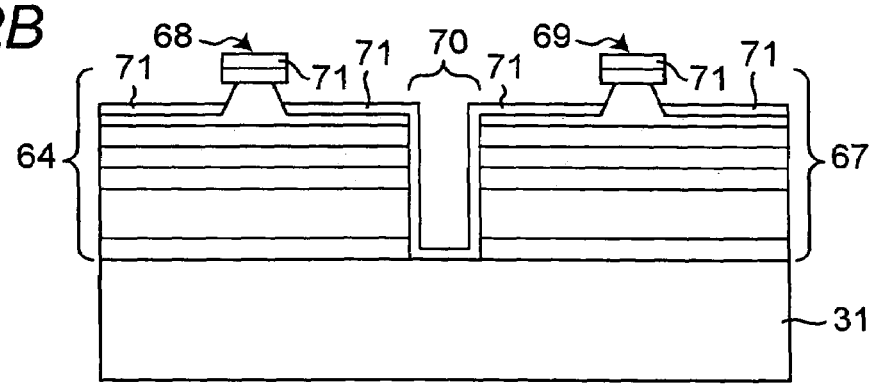

Next, as shown in FIG. 2B, a light confinement layer that has a refractive index different from that of the p-type second cladding layers 62 and 65 is formed on the whole surface including a boundary region 70 located between the AlGaAs based semiconductor laser 64 and the AlGaInP based semiconductor laser 67 by the MBE method. In the present second embodiment, an n-type GaAs layer 71 is formed as a light confinement layer that has a refractive index different from that of the p-type second cladding layers 62 and 65. The n-type GaAs layer 71 grown in the above case has a layer thickness of not greater than about 0.5 μm so that the layer can be subsequently easily removed by etching. The MBE method has high directivity, and neither of the p-type second cladding layers 62 and 65 located on the side surfaces shaded by the eaves and the p-type GaAs contact layers 63 and 66 is completely covered with the n-type GaAs layer 71. Therefore, the neighborhood of the light-emitting portion is exposed as it is, and the laser characteristics are deteriorated.

Figure 2C:
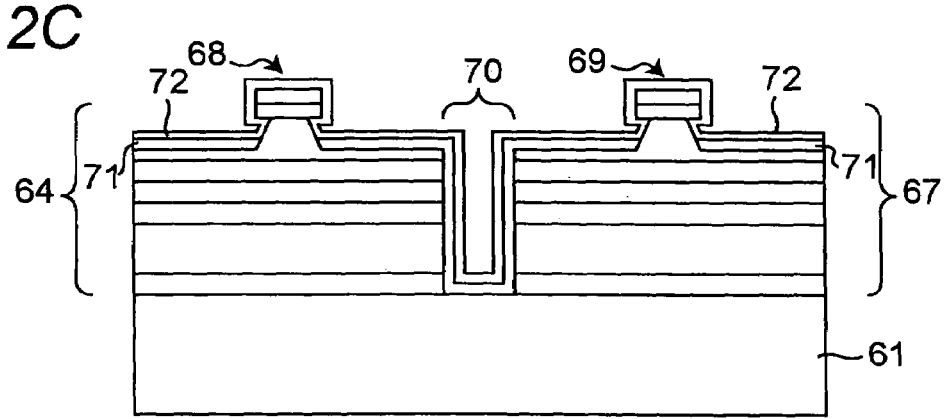

Accordingly, as shown in FIG. 2C, an SiN film 72 is formed as one example of the dielectric film on the whole surface including the boundary region 70 by PCVD (Plasma Chemical Vapor Deposition). The SiN film 72 in the above case has a film thickness of not greater than about 0.5 μm since heat dissipation is reduced as the thickness is increased. With this arrangement, the exposed surfaces of the p-type second cladding layers 62 and 65 located on the side surfaces of the ridge portions 68 and 69 are completely covered. In particular, the CVD methods such as the PCVD method are to form a film in a vapor phase state, and therefore, film formation can reliably be achieved also on the back surfaces of the eaves.

Figure 2D:
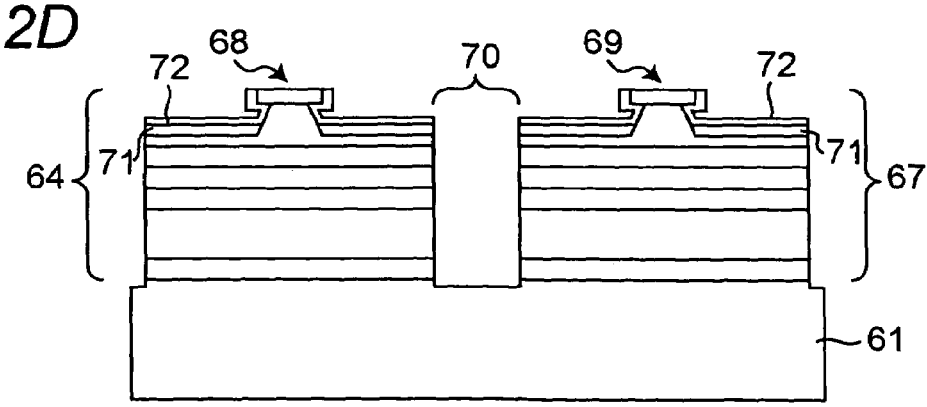
Figure 3A:
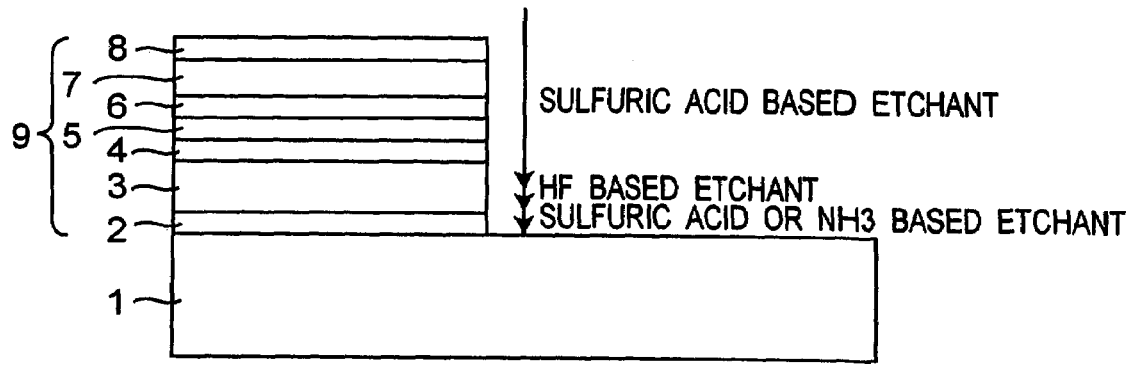
FIGS. 3A, 3B, and 3C through 3G are sectional views of a semiconductor laser device in which two semiconductor lasers are formed on a substrate in manufacturing processes.
Figure 3B:
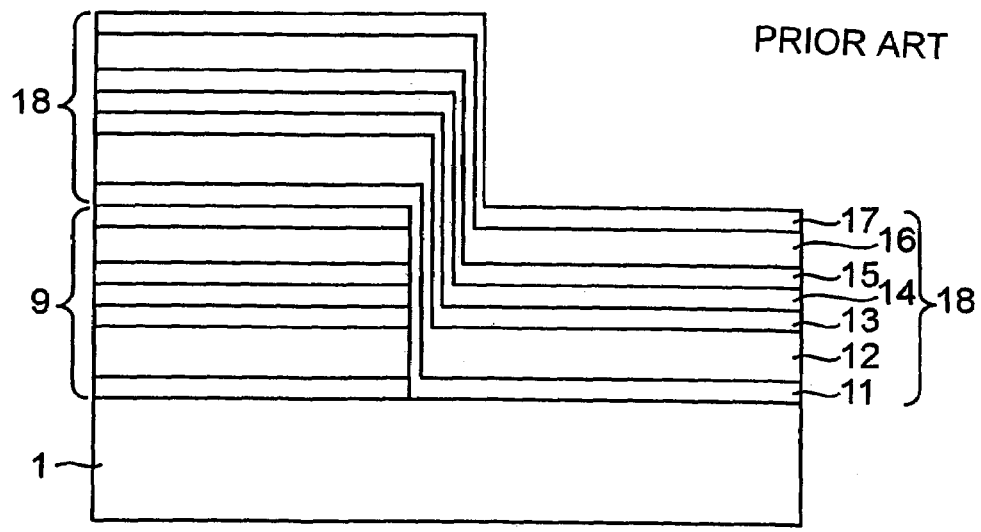
Figure 3C:
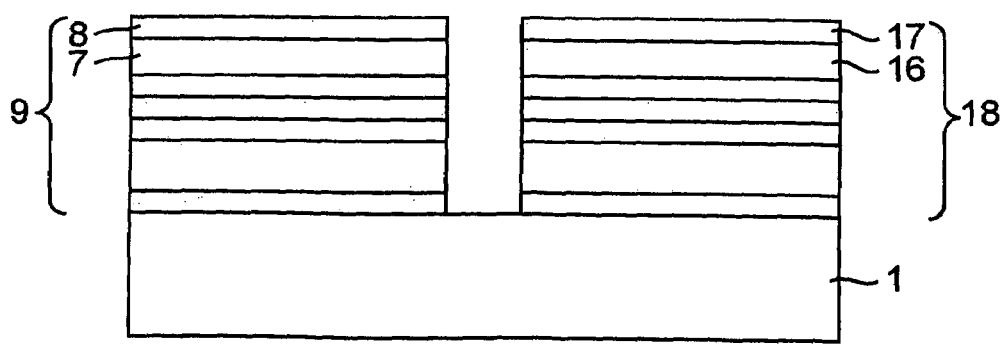
Figure 3D:
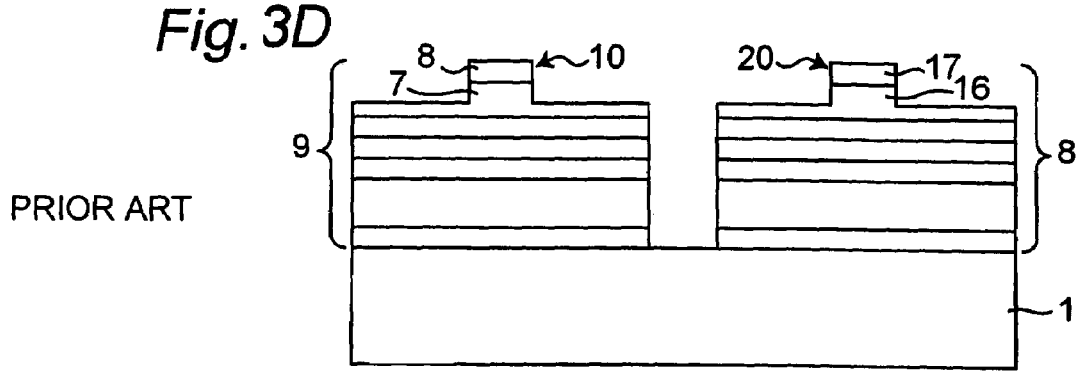
Figure 3E:
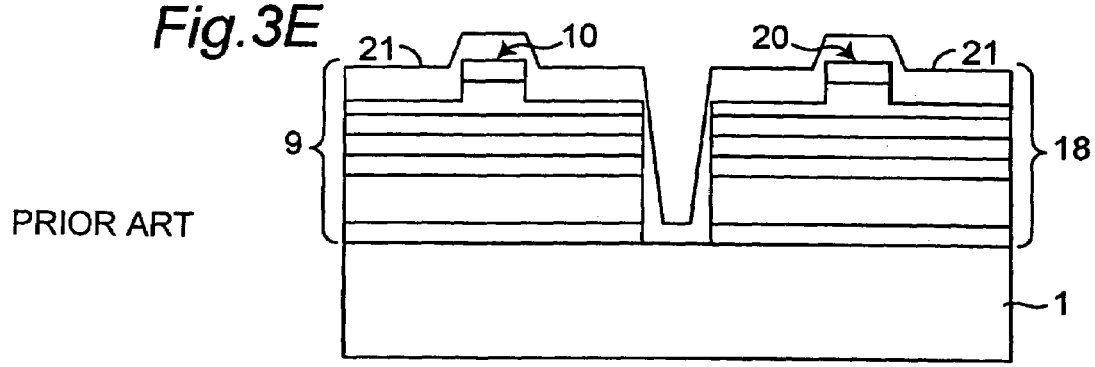
Figure 3F:
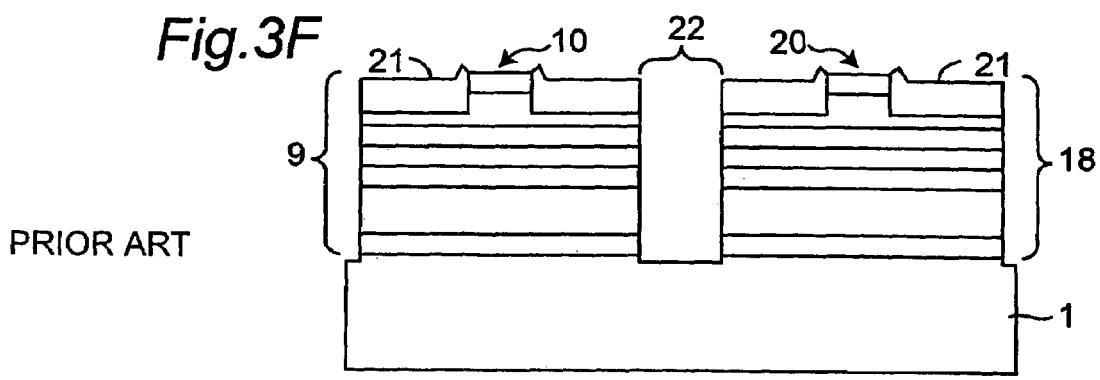
Figure 3G:
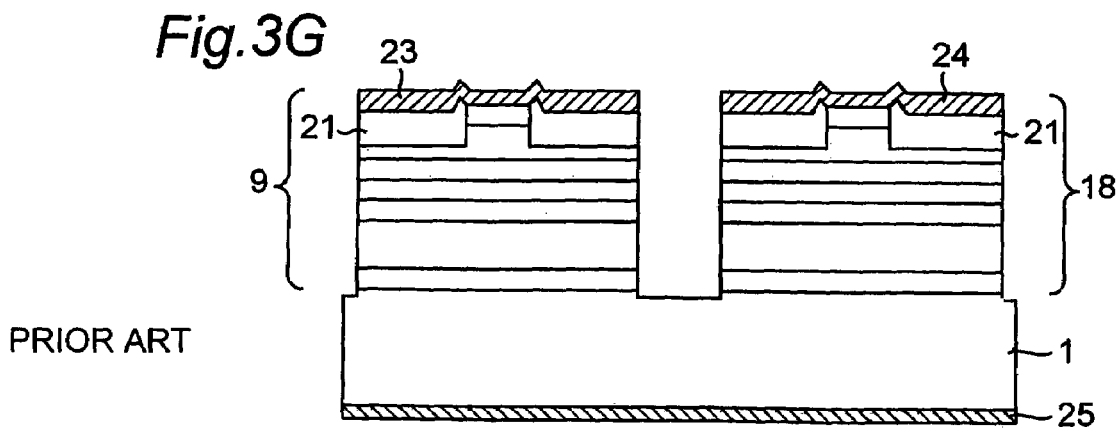
Figure 4A:
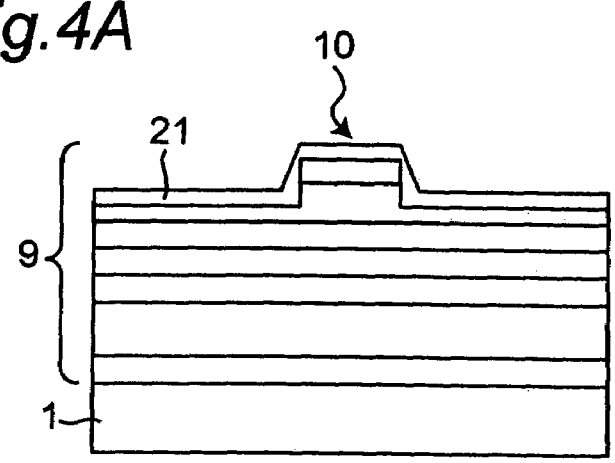
FIGS. 4A, 4B and 4C are views showing the states in which a current constriction layer in FIG. 3E is grown.
Figure 4B:
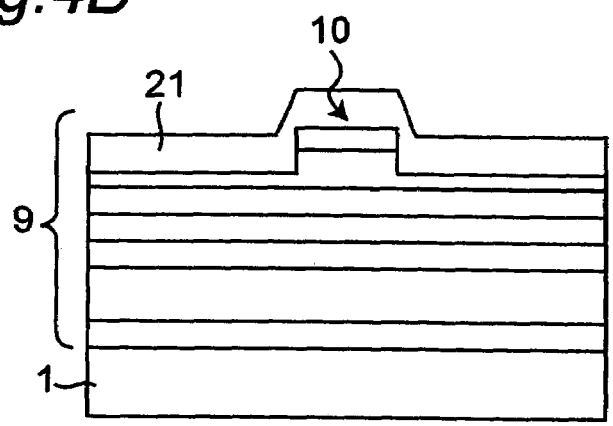
Figure 4C:
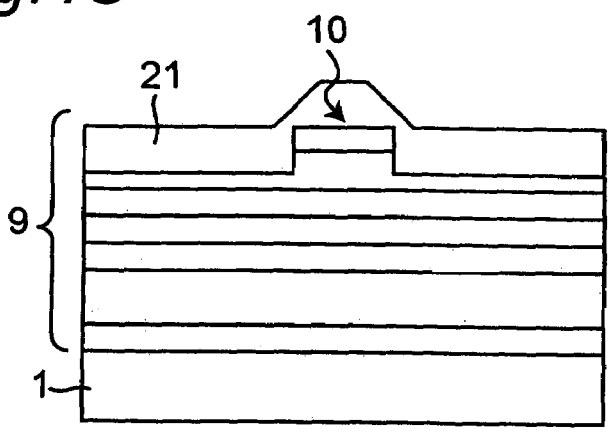
Figure 5A:
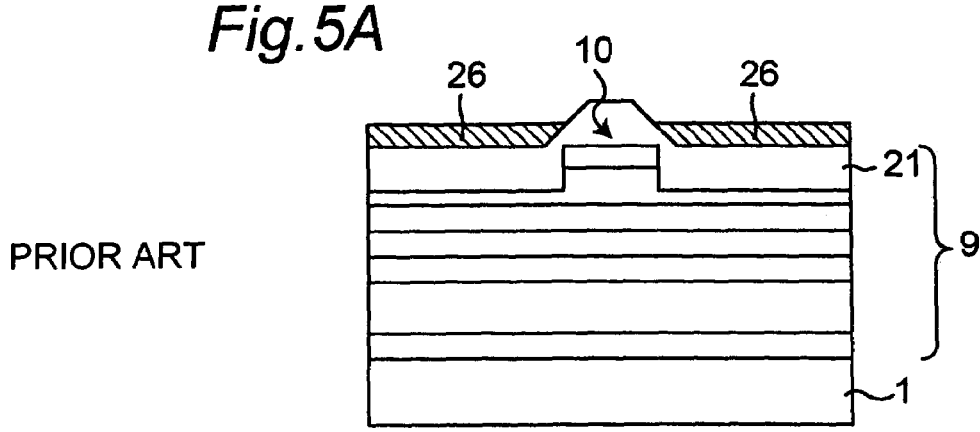
FIGS. 5A and 5B are views showing a state in which the current constriction layer grown as shown in FIGS. 4A, 4B and 4C are etched.
Figure 5B:
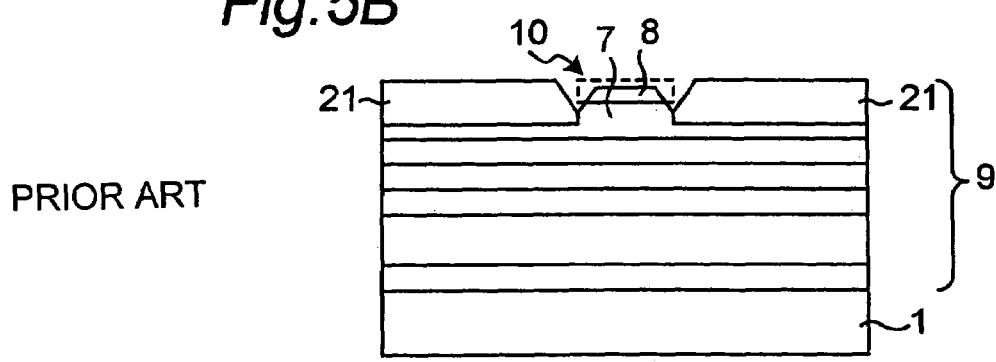
Figure 6A:
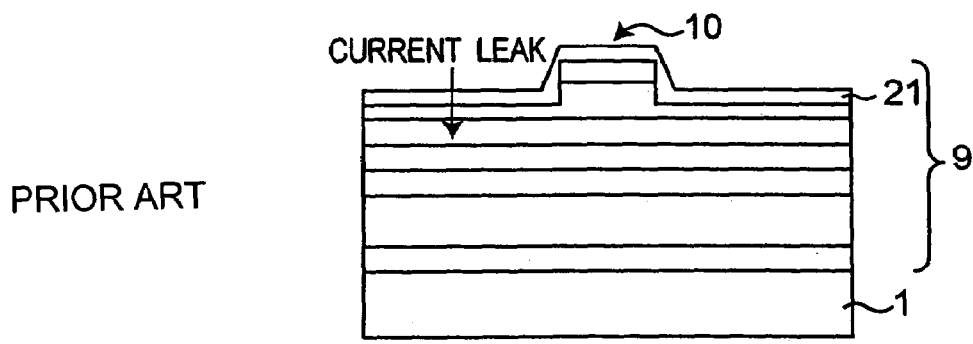
FIGS. 6A and 6B are explanatory views of a problem in the case where the current constriction layer is thinly formed in FIG. 3F.
Figure 6B:
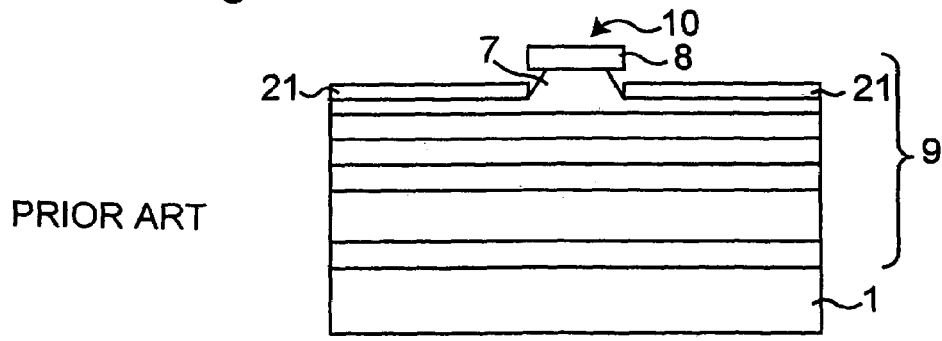

Next, a region excluding both the ridge portions 68 and 69 and the boundary region 70 located between the AlGaAs based semiconductor laser 64 and the AlGaInP based semiconductor laser 67 is protected by a resist (not shown). Then, as shown in FIG. 2D, the unnecessary SiN film 72 and n-type GaAs layer 71 formed on the ridge portions 68 and 69 and the boundary region 70 are removed by etching.

In the above case, as described above, the n-type GaAs layer 71 and the SiN film 72 are thinly formed to a thickness of not greater than 0.5 μm. For this reason, the n-type GaAs layer 71 and the SiN film 72, which are roughly flat on the ridge portions 68 and 69, can easily be removed by etching. Furthermore, the surfaces of the p-type second cladding layers 62 and 65 located on the side surfaces of the ridge portions 68 and 69 are completely covered with the SiN film 72.

Subsequently, similarly to FIG. 1J of the first embodiment, a p-type electrode (not shown) is formed on the ridge portion 68 of the AlGaAs based semiconductor laser 64 and on the ridge portion 69 of the AlGaInP based semiconductor laser 67. Further, an n-type electrode (not shown) is formed on the whole back surface of the n-type GaAs substrate 61.

Thus, a semiconductor laser device, in which two semiconductor lasers of the AlGaAs based semiconductor laser 64 and the AlGaInP based semiconductor laser 67 are integrated on one n-type GaAs substrate 61, is formed.

As described above, in the present second embodiment, the ridge portions 68 and 69 are formed on the AlGaAs based semiconductor laser 64 and the AlGaInP based semiconductor laser 67, respectively, and thereafter, the n-type GaAs layer 71, which is the light confinement layer constructed of a semiconductor that has a refractive index different from that of the second cladding layers 62 and 65, is formed to a thin film thickness of not greater than about 0.5 μm. Therefore, the n-type GaAs layer 71, which is roughly flat on the ridge portions 68 and 69, can easily be removed by etching.

However, if the n-type GaAs layer 71 is thinly formed, then the function of the current constriction layer is reduced. Furthermore, if the eaves are formed in the p-type GaAs contact layers 63 and 66 of the ridge portions 68 and 69, then the p-type second cladding layers 62 and 65 of the side surfaces of the ridge portions 68 and 69 shaded by the eaves are not completely covered with the n-type GaAs layer 71. Accordingly, by forming the SiN film 72 as a dielectric film on the n-type GaAs layer 71 by PCVD, the exposed side surfaces of the ridge portions 68 and 69 are completely covered, and the current constriction function is reinforced.

With this arrangement, there can be stably easily formed a semiconductor laser device, which has two semiconductor lasers that are able to stably carry out the confinement of light into the second cladding layers 62 and 65, prevent the deterioration of the laser characteristics and effectively carry out the confinement of current.

Each of the aforementioned embodiments has been described on the basis of the example in which two semiconductor lasers are formed on one identical semiconductor substrate. However, it is needless to say that this invention can be applied to the case where three or more semiconductor lasers are formed on one identical semiconductor substrate.

Moreover, this invention is limited to neither of the aforementioned embodiments and may also adopt a variety of combinations of the growth methods, crystal compositions and conductive types.

As is apparent from the above, in the semiconductor laser device of this invention, the light confinement layer that has a refractive index different from that of the second cladding layers and the dielectric film are successively laminated in the regions that are on the upper side of the second cladding layers of the plurality of semiconductor lasers juxtaposed on the semiconductor substrate and are other than the upper surfaces of the ridge portions. Therefore, the light confinement layer functions as a transverse mode control layer for confining light in the cladding layer. Furthermore, the dielectric film functions as a current constriction layer that flows no current in the portions other than the ridge portions.

Accordingly, there is no need to make the light confinement layer function as a current constriction layer, and the light confinement layer can be made thin within the range in which the light confinement layer can function as a transverse mode control layer. Therefore, the light confinement layer formed on the ridge portions becomes roughly flat, and the unnecessary light confinement layer on the ridge portions can easily be removed by etching. As a result, it is possible to prevent the exposure of the second cladding layers on the side surfaces of the ridge portions due to deep etching and stably achieve the confinement of light in the second cladding layers.

Moreover, the semiconductor laser device manufacturing method of this invention grows the dielectric film also on the side surfaces of the ridge portions and the back surfaces of the sidewise protrusions (the eaves) of the ridge portions by CVD in manufacturing the semiconductor laser device of the aforementioned invention. Therefore, even when the side surfaces of the ridge portions and the back surfaces of the eaves of the ridge portions are not completely covered with the light confinement layer, the second cladding layer can reliably be protected.

Accordingly, there is no portion of the second cladding layer which is exposed to the neighborhood of the active layer that emits laser light in the formed semiconductor laser device, and the confinement of the laser light in the second cladding layer can be stably achieved. As a result, stable laser characteristics can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device in which a plurality of semiconductor lasers are juxtaposed on a semiconductor substrate, the semiconductor lasers each comprising:

an active layer;

a first cladding layer and a second cladding layer arranged on both sides of the active layer; and a contact layer located on the second cladding layer, wherein part of the second cladding layer and the contact layer constitutes a ridge portion, and the semiconductor laser device comprising:

a light confinement layer, which is provided in a region other than an upper surface of the ridge portion of each of the second cladding layers and has a refractive index different from that of the second cladding layers; and a dielectric film provided on the light confinement layer, wherein the light confinement layer is sufficiently thin such that it does not function as a current constriction layer, wherein side surfaces of the contact layer and the part of the second cladding constituting the ridge portion are covered with the light confinement layer and the dielectric film, and wherein the light confinement layer is substantially flat.

2. The semiconductor laser device as claimed in claim 1, wherein the dielectric film functions as a current constriction layer that flows no current in portions other than the ridge portion.

3. The semiconductor laser device as claimed in claim 2, wherein the dielectric film is an insulation film.

4. The semiconductor laser device as claimed in claim 1, wherein the dielectric film has a film thickness of not greater than 0.5 µm.

5. The semiconductor laser device as claimed in claim 1, wherein the light confinement layer has a conductive type opposite to that of the second cladding layer.

6. The semiconductor laser device as claimed in claim 1, wherein the light confinement layer functions as a loss guide that absorbs light from the active layer and confines light in the second cladding layer.

7. The semiconductor laser device as claimed in claim 1, wherein the light confinement layer has a film thickness of not greater than 2 m.

8. A method for manufacturing the semiconductor laser device claimed in claim 1, comprising the step of:

growing the dielectric layer on side surfaces of the ridge portion and on back surfaces of sidewise protrusions of the ridge portion by a chemical vapor deposition method.

* * * * *